US005600544A

United States Patent [19]

Thalhammer

[11] Patent Number: 5,600,544

[45] Date of Patent: Feb. 4, 1997

[54] SHIELDING DEVICE FOR A BACKPLANE PLUG CONNECTOR

[75] Inventor: Erich Thalhammer, München, Germany

[73] Assignee: Siemens Aktiengesellschaft, Munich, Germany

[21] Appl. No.: 428,157

[22] PCT Filed: Oct. 8, 1993

[86] PCT No.: PCT/EP93/02761

§ 371 Date: Apr. 27, 1995

§ 102(e) Date: Apr. 27, 1995

[87] PCT Pub. No.: WO94/10726

PCT Pub. Date: May 11, 1994

[30] Foreign Application Priority Data

Oct. 29, 1992 [DE] Germany .......................... 92118540.1

[51] Int. Cl.[6] .................................................. H05K 9/00

[52] U.S. Cl. ....................... 361/816; 361/818; 174/35 C; 439/607; 439/947; 439/88; 439/92

[58] Field of Search .................................. 361/785, 788, 361/789, 816, 818; 174/35 C; 439/108, 109, 101, 607, 608, 609, 947, 95, 88, 92

[56] References Cited

U.S. PATENT DOCUMENTS

| | | | |
|---|---|---|---|
| 4,890,199 | 12/1989 | Beutler . | |
| 5,307,242 | 4/1994 | Seibold et al. | 361/818 |
| 5,479,321 | 12/1995 | Mair et al. | 361/818 |
| 5,500,788 | 3/1996 | Longueville et al. | 361/800 |
| 5,511,992 | 4/1996 | Thalhammer | 439/606 |

FOREIGN PATENT DOCUMENTS

| | | |
|---|---|---|
| 0412331 | 2/1991 | European Pat. Off. . |
| 2554979 | 5/1985 | France . |
| 9205780 U | 5/1992 | Germany . |

*Primary Examiner*—Leo P. Picard
*Assistant Examiner*—Anthony Dinkins
*Attorney, Agent, or Firm*—Hill, Steadman & Simpson

[57] ABSTRACT

To improve a shielding effect of shielding metal sheets of a backplane plug connector, the sheets are designed to be closed and are provided on inner surfaces with contact spring strips which can make contact with a shielding housing of a plug-on cable plug.

11 Claims, 2 Drawing Sheets

SHIELDING DEVICE FOR A BACKPLANE PLUG CONNECTOR

BACKGROUND OF THE INVENTION

The invention relates to a shielding device for a plug connector of a backplane printed circuit board of a mounting rack. The shielding device along the side walls of a plug housing has shielding metal sheets which are perpendicular to the backplane printed circuit board and are connected to a shielding layer of the backplane printed circuit board.

A shielding device of this type has been disclosed, for example, by the documents of German Utility Model 92 05 780.2. According to this document, the shielding metal sheets are provided with pin-like projections which can be pressed into holes in the printed circuit board. It is customary to design these holes as plated-through holes connected to the ground layers of the printed circuit board. This produces a close shielding contact between the shielding metal sheet and the ground layers.

The shielding metal sheets have a multiplicity of spring tongues which are upright in the insertion direction and can be connected to a shielding housing of a plug-on mating plug. The spring tongues are formed by being stamped from the shielding metal sheet and bent out towards the side walls of the plug housing. Perforations, which can impair the shielding effect of the shielding metal sheet, are produced in this case in the shielding metal sheet. However, there is also produced between the shielding metal sheet and the outer wall of the plugged-on shielding housing a gap which can reduce the shielding effect still further.

SUMMARY OF THE INVENTION

The invention is based on the object of improving the shielding reliability of the backplane plug connector.

The object is achieved by an improvement in a shielding device for a plug connector of a backplane printed circuit board of a mounting rack, the shielding device along the side walls of a shielding housing of the plug connector has shielding metal sheets which extend perpendicular to the backplane printed circuit board and can be connected to a ground layer of the backplane printed circuit board, said sheets have a multiplicity of spring tongues, which extend in the insertion direction and can make contact with a shielding housing of a plug-on mating plug. The improvements are that the shielding metal sheets have continuously closed areas in the region for making contact with the shielding housing of the mating plug, and that the spring tongues are in each case a component of at least one contact spring strip which bears in a contact-making manner on the inner surface of a side of the shielding metal sheet. The contact spring strip enables the shielding metal sheet to be formed without any perforations. The strip can be provided with a multiplicity of closely adjacent spring tongues which produce a multiplicity of mutually decoupled contacts and close off, in a manner so as to be radiofrequency-proof, the gap between the plugged-on shielding housing of the mating plug and the shielding metal sheet.

The contact spring strip can be configured in respect with the strips form and composition in such a way that the strip has optimum spring and contact properties. The spring metal sheet can therefore be provided with a higher rigidity. The mating plug can then additionally be guided and supported, by the shielding housing, on the shielding metal sheet, and this increases the contact reliability of the plug connection.

The spring tongues are supported at both ends on the shielding metal sheet and the double-ended support of the spring tongues means that a high contact force can be achieved, in conjunction with low material thickness, between the plugged-on shielding housing and the spring tongues. In addition, this doubles the number of contact points between the contact spring strip and the shielding metal sheet.

The contact spring strip, which is formed of a curved continuous web having a plurality of thin transverse slots so that the contact spring strips are connected at each end by a transverse web which bears on the metal sheets, can be simply produced and results in a high stability of the spring tongues even in the lateral direction. This enables the contact spring strip to be fixed on the shielding metal sheet at the side facing away from the mating plug, without the other ends of the spring tongues being damaged or buckled when the shielding housing is inserted. By virtue of the spot welding, a very good contact is produced between the contact spring strip and the shielding metal sheet at the side facing the ground layers of the printed circuit board. This means that the interference currents can be discharged to the ground layers by the shortest path.

Preferably, the shielding metal sheets have a step-shaped double bend or offset, which covers the edges or ends of the contact spring strip facing a mating plug so that the shielding housing of the mating plug cannot strike the upper edges of the contact spring strip and damage said strip.

Due to the curvature of the contact spring tongues, the distance between the contact points of the spring tongues and the associated side walls of the plug housing is smaller than the thickness of the shielding housing of the mating plug. This enables a reliable contact to be made with the spring tongues and at the same time close guidance of the shielding housing on the outer walls of the plug housing.

The shielding metal sheet preferably has apertures in the region of the double bend so that favorable attachment areas are created for the pressing tool in the region of the double bend.

The advantages of the shielding device can be utilized in particular for cable plugs which are designed as a cable plug of a shielded connecting cable and which can be plugged onto the rear side, are exposed to external mechanical effects and consequently are loaded considerably more heavily in respect of their guiding and contact properties than the assemblies which are plugged onto the front side.

The transverse shielding metal sheets with contact spring strips are arranged between the ends of the shielding metal sheets to form a four-sided arrangement extending along both a long side and the short end walls of the plug housing. However, it is also possible to arrange a plurality of these transverse shielding metal sheets so as to lie one behind the other at relatively short distances. It is then possible to plug onto the plug connector a plurality of short mating plugs in a row one behind the other. For the inner transverse metal sheets, it is then recommended to fit the contact spring strips on both sides thereof.

The crenellated apertures or edges of the shielding metal sheets facing the mating plug and the complementary tabs having a complementary crenellated shape on the contact spring strip mean that entry chamfers are formed on the contact spring strips, said chamfers bulging smoothly towards the shielding housing starting from the shielding metal sheet. This prevents the possibility of the contact spring strips being caught and damaged by the shielding housing when the mating plug is plugged on. In this case, the tabs close off the apertures, whereby the shielding effect of the transverse shielding metal sheets is improved.

The embodiment with the contact spring strips being formed on a U-shaped sheet that is received on a lower edge of the metal sheets means that only one shielding metal sheet is needed for two cable plugs which can be inserted adjacently. The two contact spring strips are cost-effectively connected to one another in one piece and fixed to the shielding metal sheet, which, for example, reduces the expenditure for the required spot welds.

Other advantages and objects will be apparent from the following description of the preferred embodiments, the drawings and claims.

DESCRIPTION OF THE PREFERRED EMBODIMENTS

Figure 1:
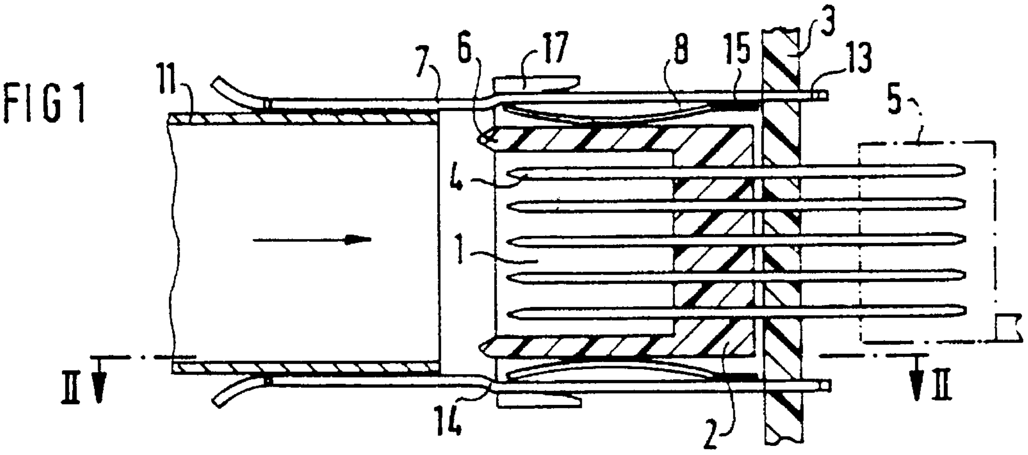
FIG. 1 is a cross sectional view in diagrammatic form through a plug connector with shielding metal sheets and a backplane printed circuit board of a rack for plug-in assemblies.
Figure 2:
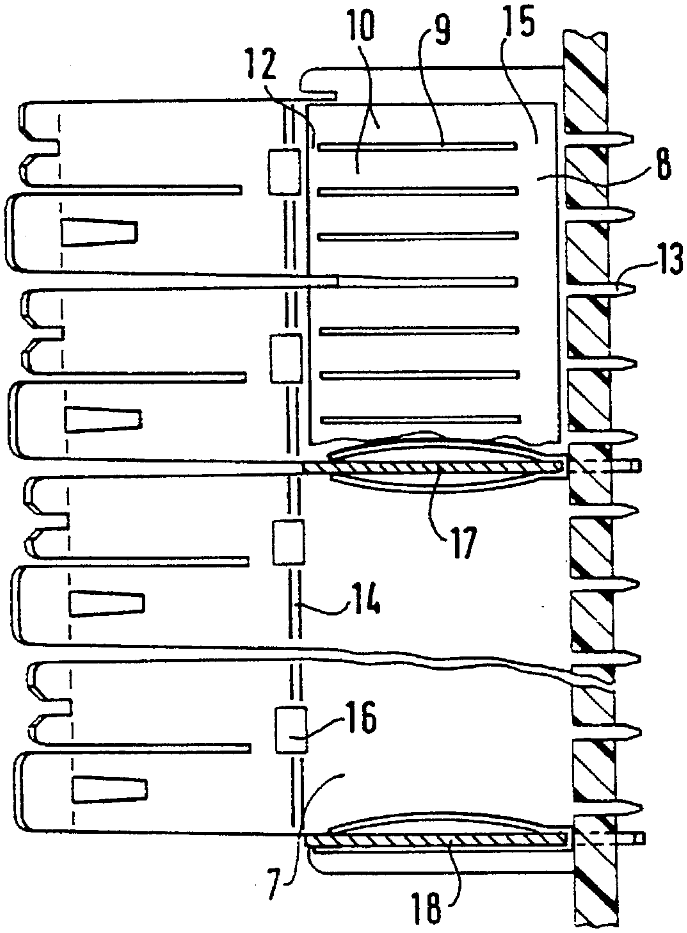
FIG. 2 is a cross sectional view taken along the line II—II in FIG. 1, and FIGS. 3–6 are views of individual shielding metal sheets according to FIGS. 1 and 2 with FIG. 3 being a side view of a first modification of the metal sheet and strip, FIG. 4 being an end view of the sheet and strip of FIG. 3, FIG. 5 being a side view of a second modification of the sheet and strip, and FIG. 6 being an end view of the sheet and strip of FIG. 5.

According to FIGS. 1 and 2, a plug connector 1 is provided with a plug housing or a shielding housing 2 which is placed onto the outer side of a backplane printed circuit board 3. The plug connector i is provided with plug pins 4 which project through the backplane printed circuit board 3 and can make contact with plug-in assemblies 5 on the inner side of said backplane printed circuit board.

There are arranged along side walls 6 of the plug housing 2 shielding metal sheets 7 which are mounted by pin-like projections 13 being pressed into plated-through holes in the backplane printed circuit board 3. The latter is designed, for example, as a multilayer board having closed ground layers on its outer side which are connected to the plated-through holes.

There are fitted to the inner sides, facing the plug connector 1, of the shielding metal sheets 7 contact spring strips 8, which are provided with a bulge towards the side walls 6 and which strips 8 are perforated by transverse slots 9. Spring tongues 10 are produced between the tranverse slots 9, said spring tongues extending in the insertion direction of a mating plug (not illustrated in more detail) whose shielding housing 11 which is illustrated in FIG. 1 to be directly above the side walls 6. The shielding housing 11 with the mating plug can be pushed over the side walls 6 in the indicated arrow direction and then makes contact with the bulges of the spring tongues 10. The latter are supported at their two ends on the shielding metal sheet 7.

The spring tongues 10 are held on a connecting web 15 at their end facing the backplane printed circuit board 3, said web being fixed on the shielding metal sheet 7 by means of spot welding, for example. At the opposite ends of the spring tongues 10, the latter are connected to one another by means of thin transverse webs 12 which are displaceably supported on the shielding metal sheet 7. The bulge is so large in this case that the distance between the spring tongues 10 and the outer wall 6 is smaller than the thickness of the shielding housing 11, whereby reliable contact-making is ensured.

The shielding metal sheet 7 has a double bend 14 above the transverse webs 12 of the contact spring strip 8, said double bend covering the outer edge of the contact spring strip 8 in the manner of an offset, with the result that the upper longitudinal edge of the contact spring strip 8 cannot be caught by the plugged-on shielding housing 11.

The shielding metal sheet 7 is designed to be closed in the region of the contact spring strip 8. The spring tongues 10 are mounted side by side so closely that they close off, in a manner so as to be radiofrequency-proof, the gap existing between the shielding metal sheet 7 and the shielding housing 11.

Figure 3:
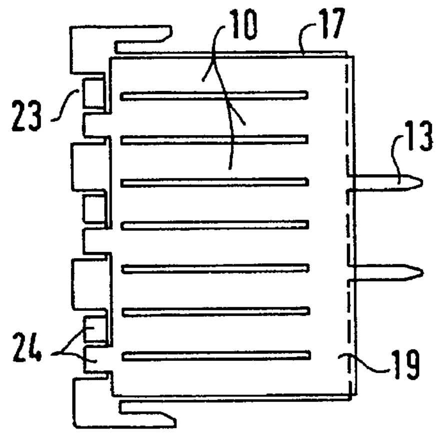
Figure 4:
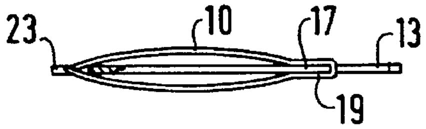
Figure 5:
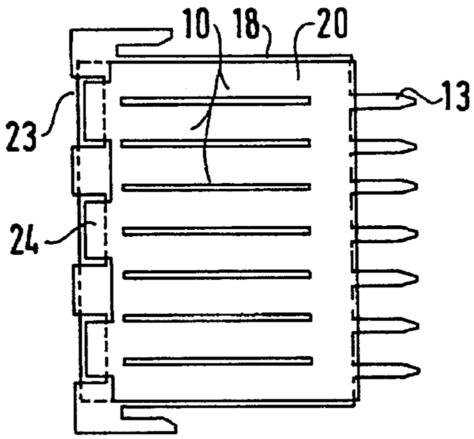
Figure 6:
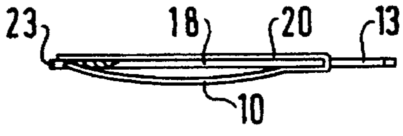

The shielding metal sheets 17, 18 according to FIGS. 3 to. 6 have crenellated apertures or edges 23 at their side facing away from the projections 13, into which apertures project tabs 24 of the contact spring strips 19, 20, said tabs closing off said apertures and having a complementary crenellated shape. Said tabs extend obliquely into the apertures 23 in the direction of curvature of the arcuate bulges in the contact spring strips 19, 20, whereby the upper edges of the tabs 24 are situated in the region covered by the shielding metal sheets (17, 18) and cannot be caught by the shielding housing, to be plugged on, of the cable plug. The inner shielding metal sheets 17 arranged between the ends of the plug connector have on both sides contact spring strips which are bent in one piece around the lower edge, facing the projections 13, of the shielding metal sheet 17. Their tabs 24 projecting into the aperture 23 are halved in width and project into the apertures 23 alternately from the one side and the other side.

I claim:

1. In a shielding device for a plug connector of a backplane printed circuit board of a mounting rack, the shielding device along the side walls of a plug housing of a plug connector having shielding metal sheets which extend perpendicular to the backplane printed circuit board which has a ground layer and said sheets having a multiplicity of spring tongues, which extend in the insertion direction and can make contact with a shielding housing of a plug-on mating plug, the improvement comprising the shielding metal sheets having continuously closed areas in the region for making contact with the shielding housing of the mating plug, and the spring tongues being in each case a component of at least one contact spring strip which bears in a contact-making manner on the inner surface of a side of the shielding metal sheet.

2. In a shielding device according to claim 1, wherein the spring tongues are arcuately curved so that the shielding housing of the mating plug can make contact with the spring tongues in a central curved region of the tongues, and wherein the spring tongues are supported at both ends on the shielding metal sheet when the mating plug is plugged on.

3. In a shielding device according to claim 2, wherein the spring tongues are formed by thin transverse slots in the contact spring strip which is curved per se to form a continuous connecting web at one end, said spring tongues are connected to one another at the other end in groups by means of at least one transverse web, and the contact spring strip has the transverse web and the connecting web being on the shielding metal sheet.

4. In a shielding device according to claim 3, wherein the continuous connecting web is situated on that end of the spring tongues facing the printed circuit board and is permanently connected to the shielding metal sheet by means of spot welding.

5. In a shielding device according to claim 1, wherein the shielding metal sheet has a step-shaped double bend which covers the edges of the contact spring strip facing the mating plug.

6. In a shielding device according to claim 5, wherein the shielding metal sheet has apertures in the region of the double bend for inserting a pressing tool.

7. In a shielding device according to claim 1, wherein the distance between the contact points of the spring tongues and associated side walls of the plug housing is smaller than the thickness of the shielding housing of the mating plug.

8. In a shielding device according to claim 1, wherein the plug connector is arranged on the outer rear side of the backplane printed circuit board, and the mating plug is designed as a cable plug of a shielded connecting cable.

9. In a shielding device according to claim 1, wherein the shielding metal sheets are arranged as longitudinal sheets with transverse sheets extending therebetween to form a rectangular box around the plug housing, each of said sheets having contact spring strips.

10. In a shielding device according to claim 9, wherein the transverse shielding metal sheets on their upper edges facing the mating plug have crenellated apertures which receive obliquely extending project tabs of the contact spring strips, said tabs having a complementary crenellated shape, and the tabs are designed as an extension of the arcuate curve of the contact spring strip.

11. In a shielding device according to claim 10, the contact spring strips for the inner transverse shielding metal sheets are bent around the lower edge of the sheet facing the printed circuit board and have bulges with spring tongues on both sides, and in each case two tabs of half the width project into the crenellated apertures, and wherein the two tabs are assigned alternately to the one leg and the other leg of the contact spring strip.

* * * * *